United States Patent
Xie et al.

(10) Patent No.: US 12,550,421 B2
(45) Date of Patent: Feb. 10, 2026

(54) VTFET WITH REDUCED PARASITIC CAPACITANCE

(71) Applicant: INTERNATIONAL BUSINESS MACHINES CORPORATION, Armonk, NY (US)

(72) Inventors: Ruilong Xie, Niskayuna, NY (US); Hemanth Jagannathan, Niskayuna, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 769 days.

(21) Appl. No.: 17/812,744

(22) Filed: Jul. 15, 2022

(65) Prior Publication Data

US 2024/0021609 A1    Jan. 18, 2024

(51) Int. Cl.
*H10D 84/83*      (2025.01)
*H10D 30/01*      (2025.01)
*H10D 30/63*      (2025.01)
*H10D 64/23*      (2025.01)
*H10D 84/01*      (2025.01)
*H10D 84/03*      (2025.01)

(52) U.S. Cl.
CPC .......... *H10D 84/83* (2025.01); *H10D 30/025* (2025.01); *H10D 30/63* (2025.01); *H10D 64/252* (2025.01); *H10D 84/013* (2025.01); *H10D 84/0149* (2025.01); *H10D 84/0151* (2025.01); *H10D 84/016* (2025.01); *H10D 84/038* (2025.01)

(58) Field of Classification Search
CPC ...... H10B 63/34; H10D 30/63; H10D 84/016; H10D 84/0195; H10D 30/0291–0297; H10D 30/66–669; H10D 30/6728; H10K 10/491
See application file for complete search history.

(56) References Cited

U.S. PATENT DOCUMENTS 6,426,252 B1    7/2002   Radens
6,566,177 B1    5/2003   Radens
(Continued)

OTHER PUBLICATIONS

Disclosed Anonymously, "Dual liner with L-shaped Sacrificial Spacer Scheme for VTFET Bottom Spacer and RX Formation", IP.com No. IPCOM000262332D, May 20, 2020, 7 pages.
(Continued)

*Primary Examiner* — Maliheh Malek
(74) *Attorney, Agent, or Firm* — Yuanmin Cai

(57) ABSTRACT

Embodiments of present invention provide a transistor structure. The transistor structure includes a first vertical fin of a first vertical transistor, the first vertical fin having a first and a second sidewall and a first and a second vertical end; a first bottom source/drain (S/D) region underneath the first vertical fin, wherein the first bottom S/D region having an edge that vertically aligns with the first vertical end of the first vertical fin; and a first gate stack surrounding the first vertical fin, wherein the first bottom S/D region horizontally extends beyond the first vertical fin, except at the edge of the first bottom S/D region that vertically aligns with the first vertical end of the first vertical fin, to have at least a portion vertically underneath the first gate stack. A method of manufacturing the transistor structure is also provided.

16 Claims, 7 Drawing Sheets

(56) References Cited

U.S. PATENT DOCUMENTS

| | | | | |
|---|---|---|---|---|
| 9,111,853 | B2* | 8/2015 | Surthi | H10D 62/151 |
| 9,530,863 | B1* | 12/2016 | Zhang | H10D 30/025 |
| 9,530,866 | B1* | 12/2016 | Zhang | H10D 30/6735 |
| 9,799,749 | B1* | 10/2017 | Bi | H10D 62/122 |
| 9,853,028 | B1 | 12/2017 | Cheng | |
| 9,859,166 | B1* | 1/2018 | Cheng | H10D 84/013 |
| 9,882,025 | B1* | 1/2018 | Zhang | H10D 30/025 |
| 10,014,409 | B1 | 7/2018 | Wu | |
| 10,068,987 | B1 | 9/2018 | Zang | |
| 10,236,215 | B1* | 3/2019 | Xie | H10D 84/038 |
| 10,263,122 | B1* | 4/2019 | Zang | H10D 30/6735 |
| 10,276,687 | B1* | 4/2019 | Bao | H10D 64/018 |
| 10,283,608 | B2* | 5/2019 | Zhang | H01L 23/53266 |
| 10,312,154 | B2 | 6/2019 | Xie | |
| 10,461,174 | B1* | 10/2019 | Chi | H10D 30/025 |
| 10,461,186 | B1* | 10/2019 | Zhang | H10D 84/038 |
| 10,529,850 | B2 | 1/2020 | Yeung | |
| 10,622,260 | B2* | 4/2020 | Xie | H10D 84/0188 |
| 10,916,638 | B2* | 2/2021 | Cheng | H01L 21/76843 |
| 10,930,758 | B2* | 2/2021 | Mochizuki | H10D 64/021 |
| 10,985,064 | B2* | 4/2021 | Zhang | H01L 21/76816 |
| 11,043,588 | B2* | 6/2021 | Razavieh | H10D 62/83 |
| 11,139,399 | B2* | 10/2021 | Li | H10D 30/024 |
| 11,152,265 | B2* | 10/2021 | Xie | H10D 84/83 |
| 11,177,367 | B2* | 11/2021 | Li | H01L 21/3065 |
| 11,251,285 | B2* | 2/2022 | Bao | H10D 30/6713 |
| 11,417,737 | B2* | 8/2022 | Huang | H10D 64/252 |
| 11,615,992 | B2* | 3/2023 | Miller | H10D 30/025 257/351 |
| 11,710,699 | B2* | 7/2023 | Xie | H01L 21/76897 257/329 |
| 11,757,036 | B2* | 9/2023 | Xie | H10D 30/63 257/329 |
| 12,255,204 | B2* | 3/2025 | Xie | H10D 30/63 |
| 2005/0285175 | A1 | 12/2005 | Cheng | |
| 2009/0042347 | A1* | 2/2009 | Oyu | H10D 64/516 257/E27.096 |
| 2010/0140671 | A1* | 6/2010 | Nojima | H10B 12/34 257/E21.21 |
| 2011/0253981 | A1* | 10/2011 | Rooyackers | H10D 12/021 977/840 |
| 2015/0091100 | A1* | 4/2015 | Xie | H10D 30/6211 438/424 |
| 2017/0358497 | A1* | 12/2017 | Cheng | H01L 21/02532 |
| 2018/0069131 | A1* | 3/2018 | Balakrishnan | H10D 30/025 |
| 2018/0096996 | A1* | 4/2018 | Bi | H10D 84/038 |
| 2018/0226489 | A1* | 8/2018 | Bi | H10D 62/115 |
| 2019/0378765 | A1* | 12/2019 | Xie | H10D 84/0186 |
| 2020/0052079 | A1 | 2/2020 | Li | |
| 2020/0286955 | A1* | 9/2020 | Cheng | H10B 63/34 |
| 2020/0343241 | A1* | 10/2020 | Wu | H10D 84/0149 |
| 2020/0357898 | A1* | 11/2020 | Lee | H10D 30/025 |
| 2020/0365728 | A1* | 11/2020 | Razavieh | H10D 64/518 |
| 2020/0373413 | A1* | 11/2020 | Song | H10D 30/63 |
| 2020/0411436 | A1* | 12/2020 | Xie | H01L 21/02126 |
| 2021/0167129 | A1* | 6/2021 | Reznicek | H10N 70/8418 |
| 2021/0193737 | A1* | 6/2021 | Reznicek | H10N 70/20 |
| 2022/0165850 | A1* | 5/2022 | Ando | H10D 30/025 |
| 2023/0022802 | A1* | 1/2023 | Wang | H01L 21/76897 |
| 2023/0207697 | A1* | 6/2023 | Xie | H10D 30/6211 257/288 |
| 2024/0014208 | A1* | 1/2024 | Xie | H10D 84/0151 |
| 2024/0072164 | A1* | 2/2024 | Xie | H10D 64/018 |
| 2024/0186375 | A1* | 6/2024 | Anderson | H10D 64/512 |
| 2024/0186376 | A1* | 6/2024 | Anderson | H10D 62/127 |
| 2024/0194756 | A1* | 6/2024 | Huang | H10D 62/121 |

OTHER PUBLICATIONS

Disclosed Anonymously, "Method and Structure for VTFET Bottom Spacer Formation with Selective Titanium", IP.com No. IPCOM000258597D, May 28, 2019, 6 pages.

Lu et al., "Characterization of a Body-Tied Vertical MOSFET," © 2010 IEEE, 4 pages.

* cited by examiner

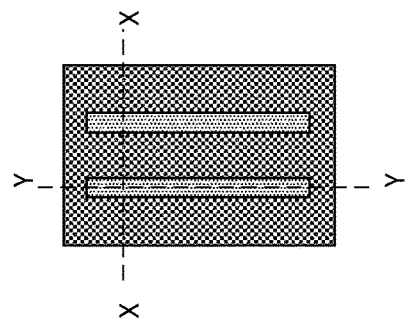
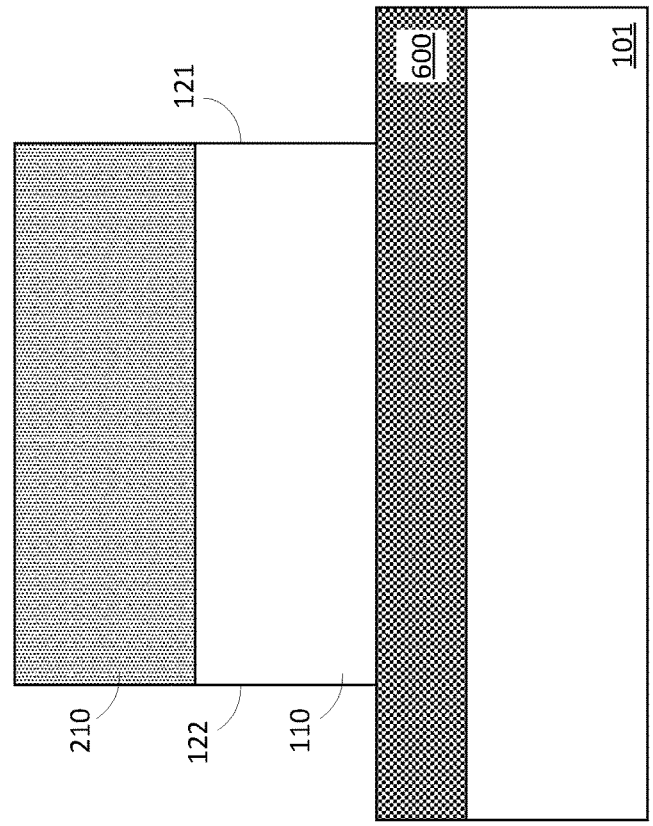
FIG. 2B
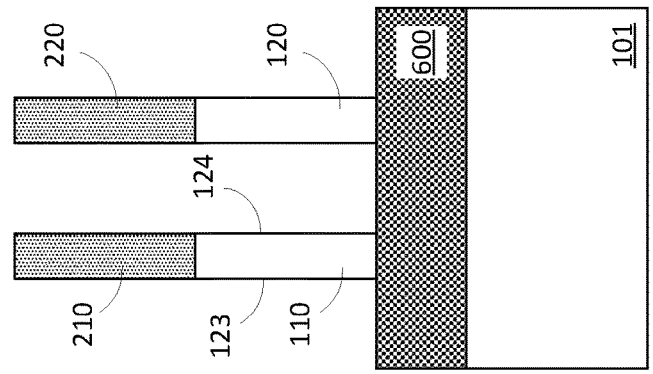
FIG. 2A

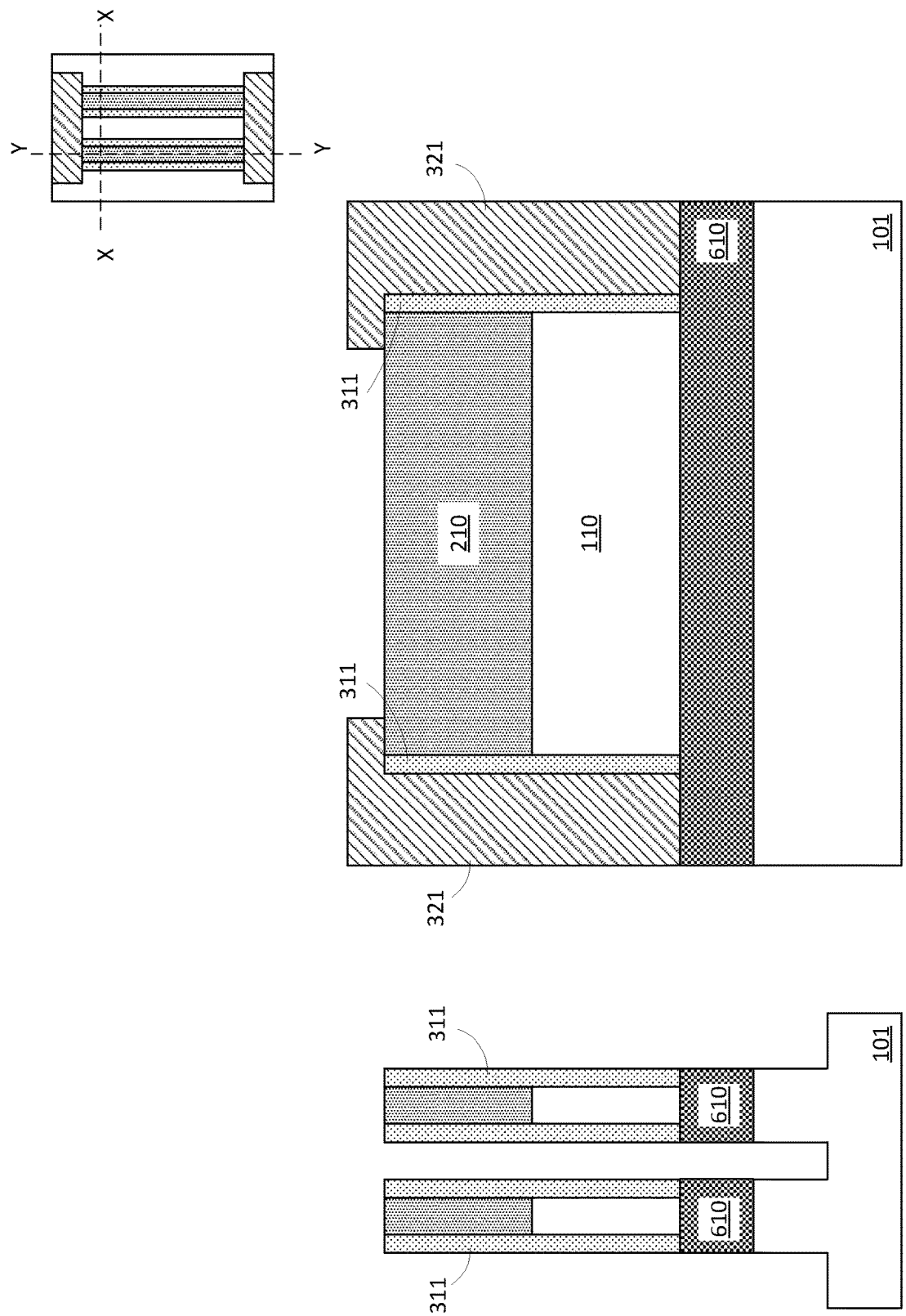

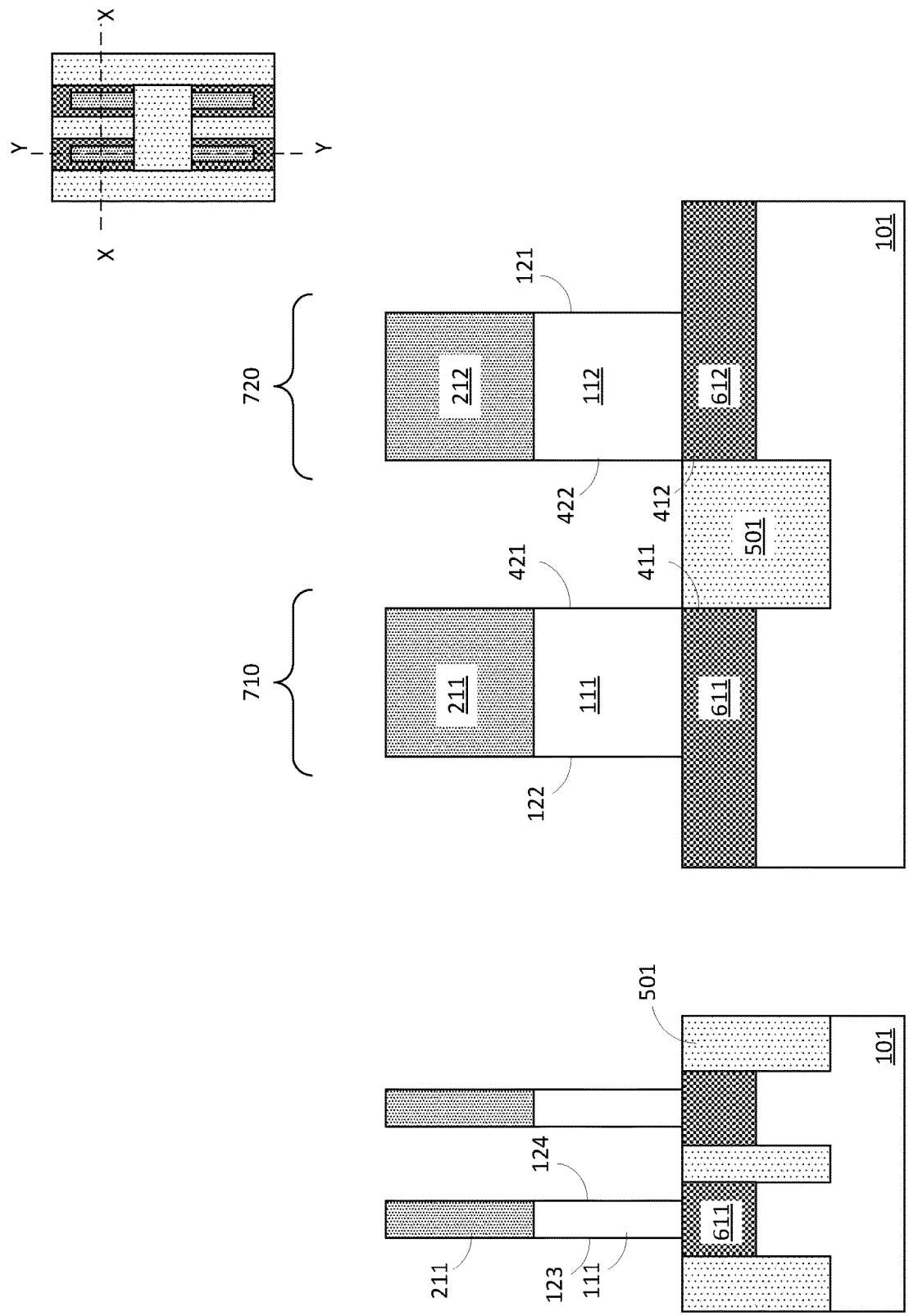

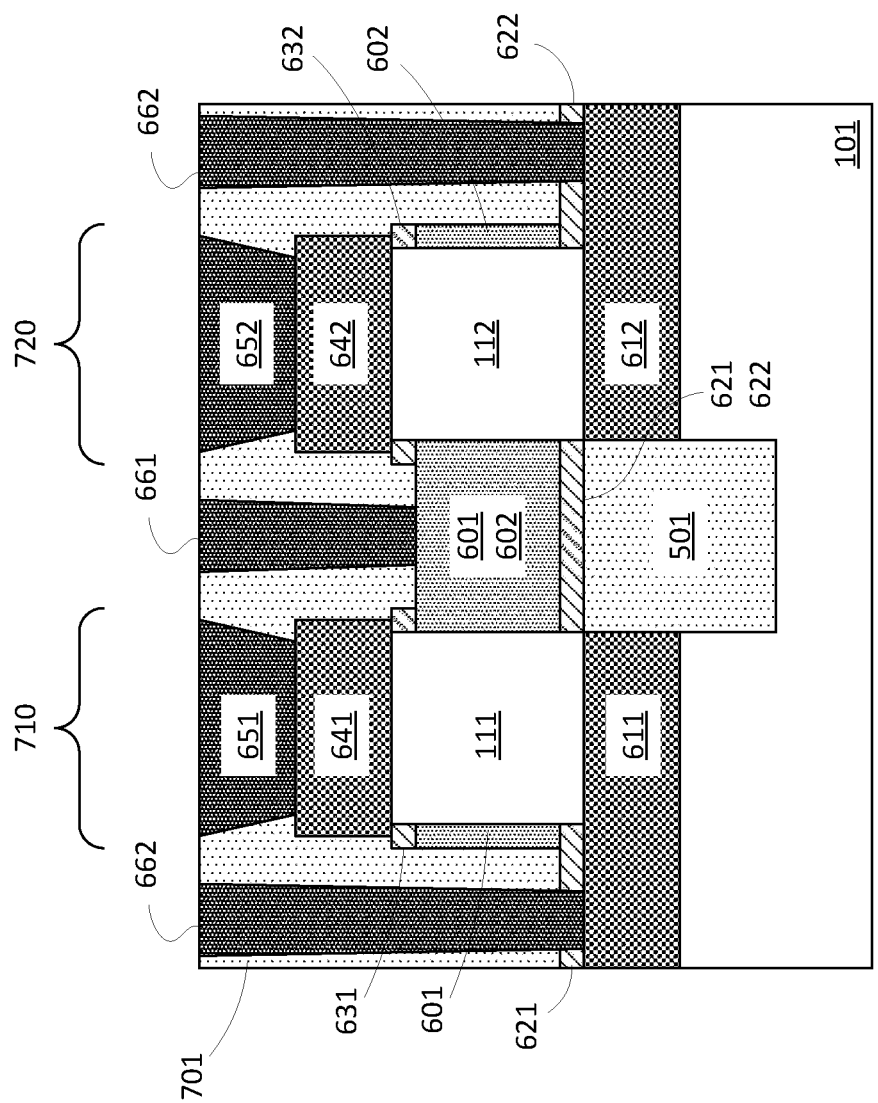
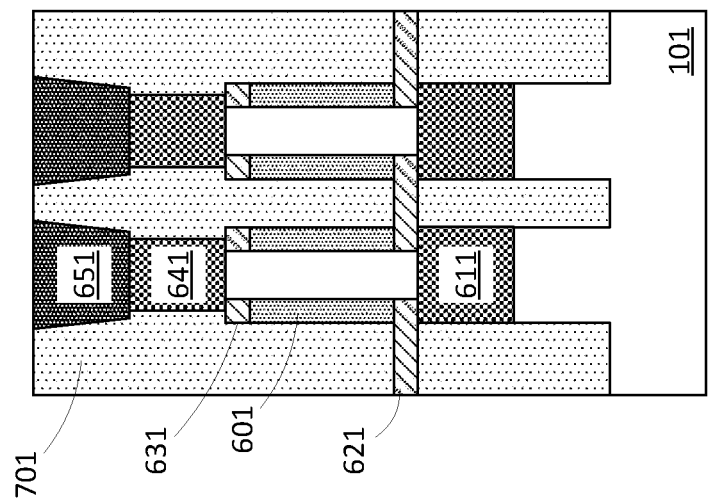
FIG. 6B
FIG. 6A

VTFET WITH REDUCED PARASITIC CAPACITANCE

BACKGROUND

The present application relates to manufacturing of semiconductor integrated circuits. More particularly, it relates to a vertical field effect transistor with reduced parasitic capacitance and method of making the same.

As semiconductor industry moves towards smaller node, for example 7-nm node and beyond, field-effect-transistors (FETs) are aggressively scaled in order to fit into this ever-decreasing footprint or real estate, as dictated by the node size, with increased device density. Among various types of FETs, non-planar FETs such as fin-type FETs and particularly fin-based vertical transistors (VTFETs) are particularly suited to meet this continued device scaling needs.

Various transistors are generally isolated from each other by shallow-trench-isolation (STI) in a substrate. For example, bottom source/drain (S/D) regions of two neighboring vertical transistors are generally isolated from each other by a STI region that situates in between the two bottom S/D regions. However, with the currently existing art of manufacturing process, the STI region formed thereby is often not immediately adjacent, vertically, to the vertical ends of the two vertical fins of the two vertical transistors, resulting in a gap between the vertical end of the fin and the edge of the bottom S/D region. When a gate contact is later formed that surrounds the vertical fin, this gap results in unwanted parasitic capacitance between the gate and the bottom S/D region, which affects the operational speed of the vertical transistor.

SUMMARY

Embodiments of present invention provide a transistor structure. The transistor structure includes a first vertical fin of a first vertical transistor, the first vertical fin having a first and a second sidewall and a first and a second vertical end; a first bottom source/drain (S/D) region underneath the first vertical fin, wherein the first bottom S/D region having an edge that vertically aligns with the first vertical end of the first vertical fin; and a first gate stack surrounding the first vertical fin, wherein the first bottom S/D region horizontally extends beyond the first vertical fin, except at the edge of the first bottom S/D region that vertically aligns with the first vertical end of the first vertical fin, to have at least a portion vertically underneath the first gate stack. In one embodiment, the portion of the first bottom S/D region vertically underneath the first gate stack at the first sidewall and at the second sidewall has a same horizontal thickness.

According to one embodiment, the transistor structure further includes a shallow-trench-isolation (STI) region adjacent to the edge of the first bottom S/D region, and a bottom spacer above the STI region and adjacent to the first end of the first vertical fin, the bottom spacer being vertically aligned with the STI region at the edge of the first bottom S/D region.

According to another embodiment, the transistor structure further includes a second vertical fin of a second vertical transistor, the second vertical fin having a first and a second vertical end; and a second bottom S/D region of the second vertical transistor, wherein the second vertical end of the second vertical fin opposes the first vertical end of the first vertical fin, and the second bottom S/D region has an edge that vertically aligns with the second vertical end of the second vertical fin of the second vertical transistor.

In one embodiment, the STI region extends horizontally from the edge of the first bottom S/D region of the first vertical transistor to the edge of the second bottom S/D region of the second vertical transistor.

In another embodiment, the bottom spacer extends horizontally from the first vertical end of the first vertical fin of the first vertical transistor to the second vertical end of the second vertical fin of the second vertical transistor.

Embodiments of present invention further provide a method of forming a transistor structure. The method includes forming a raw vertical fin; forming a conformal spacer lining a first and a second sidewall and a first and a second vertical end of the raw vertical fin; patterning a bottom source/drain (S/D) layer into a raw bottom S/D region using the conformal spacer as an etch mask; performing a cutting process to cut the raw vertical fin into a first and a second vertical fin and the raw bottom S/D region into a first and a second bottom S/D region, respectively, of a first and a second vertical transistor; forming a shallow-trench-isolation (STI) region between the first and the second bottom S/D region; and forming additional features of the first and the second vertical transistor.

BRIEF DESCRIPTION OF THE DRAWINGS

The present invention will be understood and appreciated more fully from the following detailed description of embodiments of present invention, taken in conjunction with accompanying drawings of which:

FIGS. 2A and 2B are demonstrative illustrations of cross-sectional views of a transistor structure in a step of manufacturing thereof, following the step illustrated in FIGS. 1A and 1B, according to one embodiment of present invention;

FIGS. 3A and 3B are demonstrative illustrations of cross-sectional views of a transistor structure in a step of manufacturing thereof, following the step illustrated in FIGS. 2A and 2B, according to one embodiment of present invention;

FIGS. 5A and 5B are demonstrative illustrations of cross-sectional views of a transistor structure in a step of manufacturing thereof, following the step illustrated in FIGS. 4A and 4B, according to one embodiment of present invention;

FIGS. 6A and 6B are demonstrative illustrations of cross-sectional views of a transistor structure in a step of manufacturing thereof, following the step illustrated in FIGS. 5A and 5B, according to one embodiment of present invention.

Figure 1B:
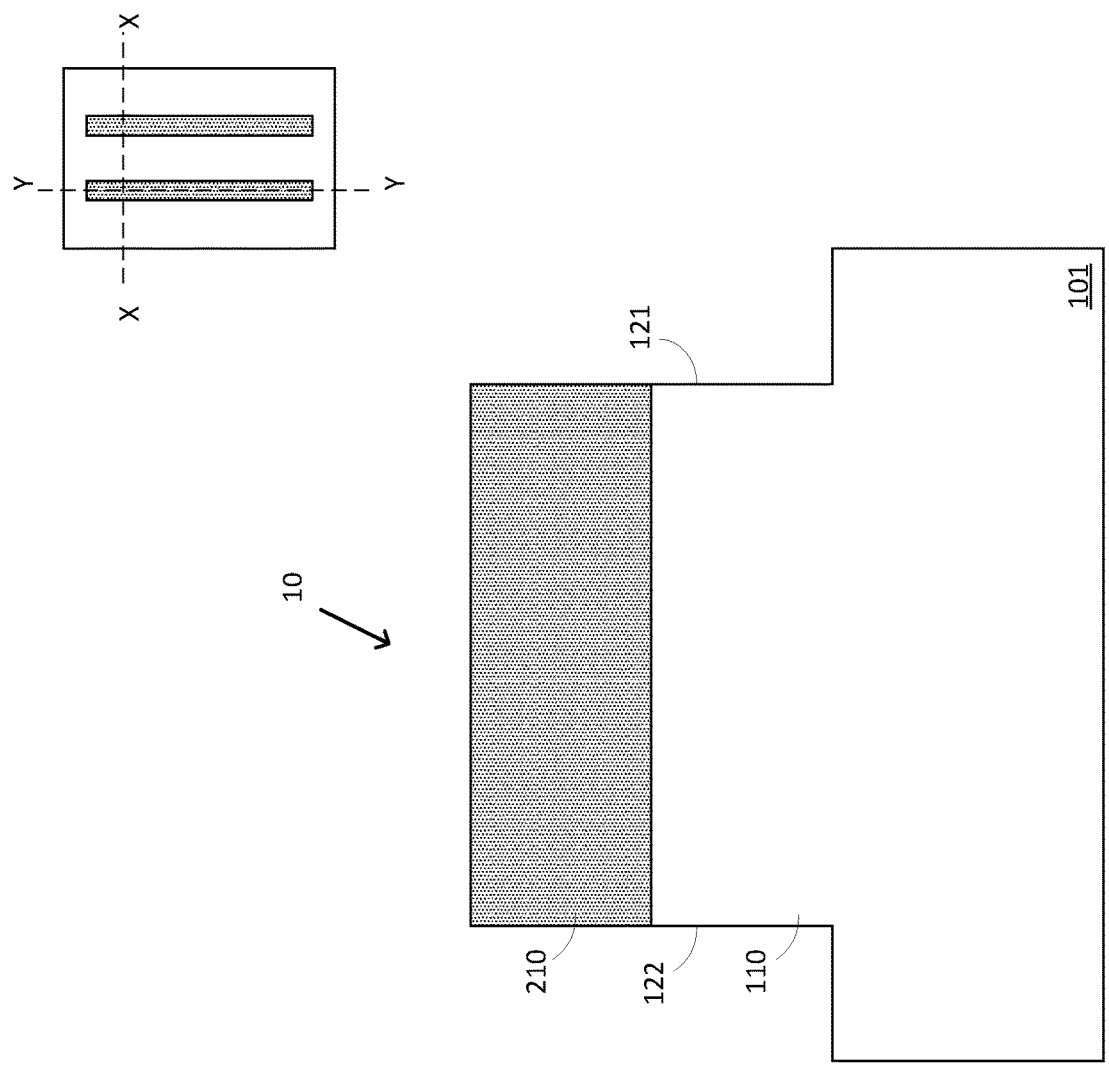
FIGS. 1A and 1B are demonstrative illustrations of cross-sectional views of a transistor structure in a step of manufacturing thereof according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

Figure 1A:
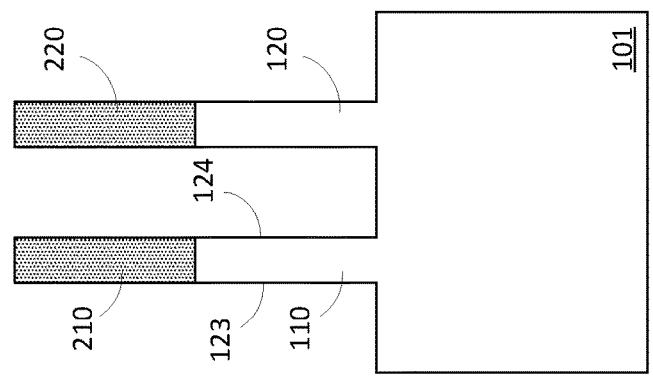

FIGS. 1A and 1B are demonstrative illustrations of cross-sectional views of a transistor structure in a step of manufacturing thereof according to one embodiment of present invention. More specifically, with reference to a simplified illustration of layout at the upper-right corner, FIG. 1A illustrates a cross-sectional view of a transistor structure 10 along a dashed line X-X, perpendicular to fins, and FIG. 1B illustrates a cross-sectional view of the transistor structure 10 along a dashed line Y-Y parallel to and along a fin.

Similarly, FIGS. 2A-2B to FIGS. 6A-6B illustrate cross-sectional reviews of the transistor structure 10, at various manufacturing stages, in a manner corresponding to FIGS. 1A-1B respectively.

More particularly, embodiments of present invention include forming one or more fins such as, for example, a first and second raw vertical fins 110 and 120 on top of a substrate 101. For example, the first and second raw vertical fins 110 and 120 may be formed by first forming hard masks 210 and 220 on top of the substrate 101 and subsequently etching the substrate 101 to form the first and second raw vertical fins 110 and 120. However, embodiments of present invention are not limited in this aspect and the first and second raw vertical fins may be formed by other methods or means. In addition, the substrate 101 may be a bulk substrate such as a silicon (Si) substrate or a germanium (Ge) substrate, a silicon-on-insulator (SOI) substrate, a silicon-germanium-on-insulator (SiGeOI) substrate, or any other suitable substrate.

The first and second raw vertical fins 110 and 120 may have first and second sidewalls and first and second vertical ends respectively. For example, the first raw vertical fin 110 may have a first sidewall 123, a second sidewall 124, a first vertical end 121, and a second vertical end 122.

FIGS. 2A and 2B are demonstrative illustrations of cross-sectional views of a transistor structure in a step of manufacturing thereof, following the step illustrated in FIGS. 1A and 1B, according to one embodiment of present invention. More particularly, embodiments of present invention include forming a bottom source/drain (S/D) layer 600 underneath the first and second raw vertical fins 110 and 120, and the bottom S/D layer 600 may be epitaxially formed. For example, a protective sidewall liner (not shown) may be formed to protect the first and second sidewalls 123 and 124 and the first and second vertical ends 121 and 122. After that, the substrate 101 may first be etched to create openings next to the raw vertical fins 110 and 120 and a bottom epitaxial layer may subsequently be grown inside the openings. The growth of the bottom epitaxial layer may be followed by, for example, an annealing process and/or other suitable means that drives dopants into and underneath the raw vertical fins 110 and 120 thereby forming transforming the bottom epitaxial layer into the bottom S/D layer 600. The bottom S/D layer 600 may be an epitaxial boron doped silicon-germanium (SiGe) layer for PFET or phosphorous doped Si for NFETs. After the drive-in anneal, the protective sidewall liner may be removed.

FIGS. 3A and 3B are demonstrative illustrations of cross-sectional views of a transistor structure in a step of manufacturing thereof, following the step illustrated in FIGS. 2A and 2B, according to one embodiment of present invention. More particularly, embodiments of present invention include forming a conformal spacer 311. The conformal spacer 311 lines sidewalls and vertical ends of the raw vertical fins. For example, the conformal spacer 311 may line the first sidewall 123, the second sidewall 124, the first vertical end 121, and the second vertical end 122 of the first raw vertical fin 110.

Embodiments of present invention also include forming a patterning mask 321, e.g., an organic planarization layer (OPL), at the first and second vertical ends of the raw vertical fins. For example, the patterning mask 321 covers portions of the bottom S/D layer 600 at the first and second vertical ends 121 and 122 of the raw vertical fin 110. Subsequently, embodiments of present invention include performing an anisotropic directional patterning process that patterns the bottom S/D layer 600 into a raw bottom S/D region 610 using the conformal spacer 311 and the patterning mask 321 as an etch mask. The patterning process etches further into the substrate 101 as is demonstratively illustrated in FIG. 3A.

The raw bottom S/D region 610 are generally directly underneath the raw vertical fins. In one embodiment, the raw bottom S/D region 610 extend horizontally beyond the raw vertical fins 110 and 120 to have a portion underneath the conformal spacer 311 and/or the patterning mask 321. A portion beyond the raw vertical fins at the first sidewall 123 and the second sidewall 124 may have a same horizontal thickness.

Figure 4B:
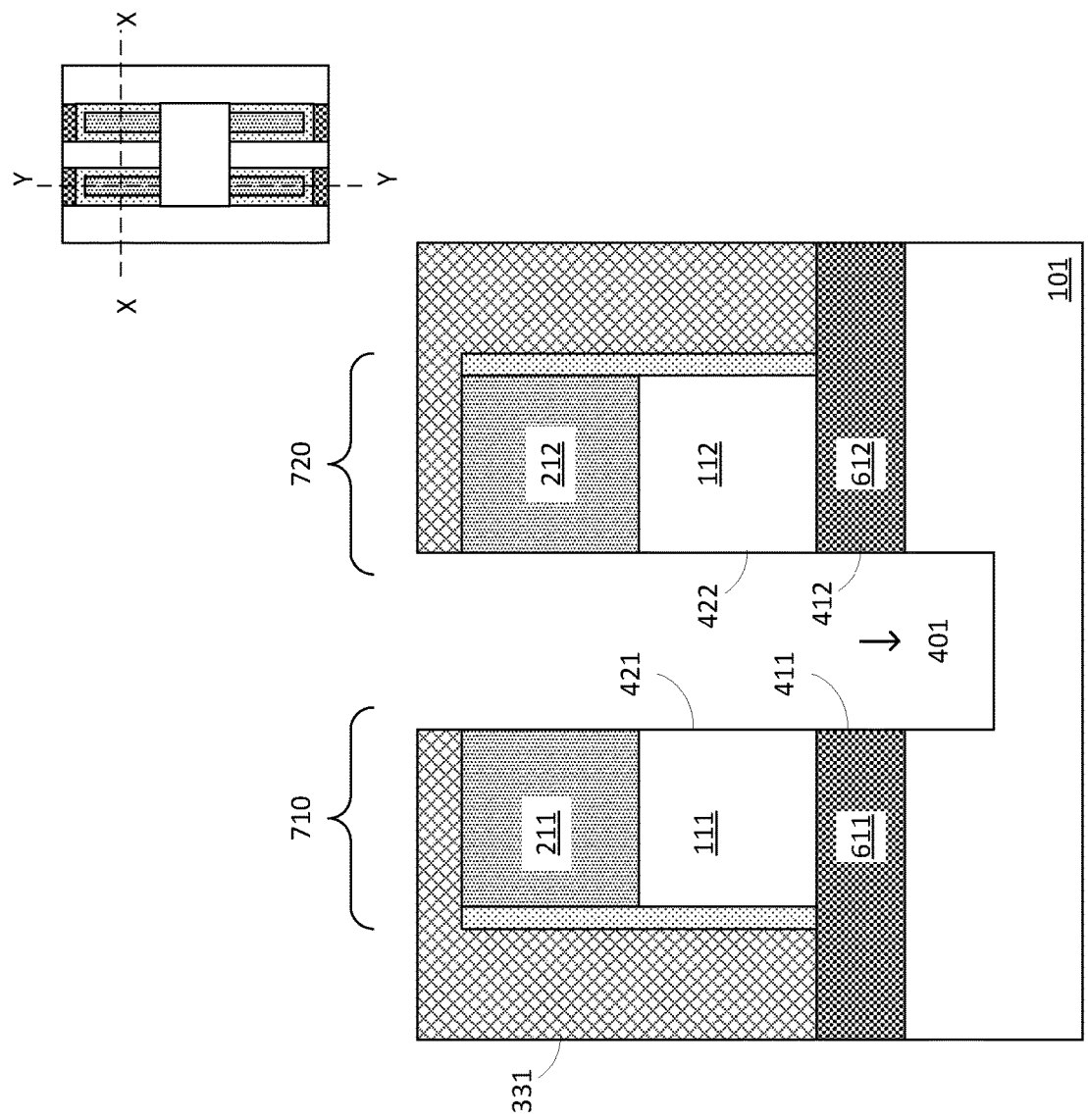
FIGS. 4A and 4B are demonstrative illustrations of cross-sectional views of a transistor structure in a step of manufacturing thereof, following the step illustrated in FIGS. 3A and 3B, according to one embodiment of present invention.
Figure 4A:
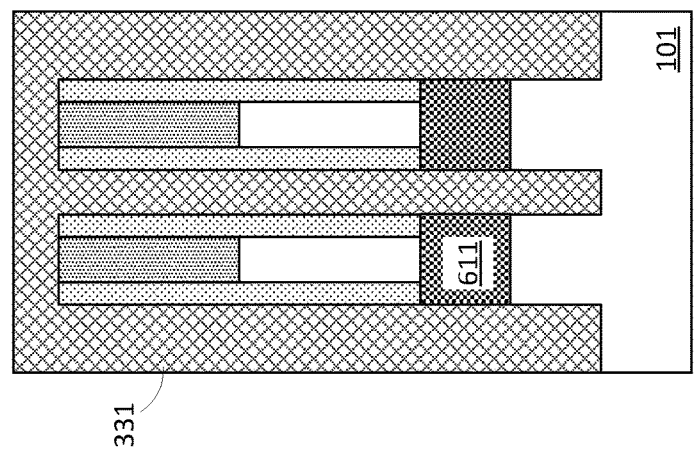

FIGS. 4A and 4B are demonstrative illustrations of cross-sectional views of a transistor structure in a step of manufacturing thereof, following the step illustrated in FIGS. 3A and 3B, according to one embodiment of present invention. More particularly, after the patterning of the raw bottom S/D region 610, embodiments of present invention may include removing the patterning mask 321. Subsequently, a patterning mask 331 may be formed by conventional lithographic and etching process to cover a substantial portion of the raw vertical fins. The patterning mask 331 may be used to define where the fin-cut is at vertical end of the gate contact, as being described below in more details.

Subsequently, embodiments of present invention include performing a cutting process that cuts through the first and second raw vertical fins 110 and 120 and the raw bottom S/D region 610 to create an opening 401. The opening 401 may be cut deep below a level of the raw bottom S/D region 610. For example, the cutting process cuts the raw vertical fin 110 into a first vertical fin 111 and a second vertical fin 112 and the raw bottom S/D region 610 into a first bottom S/D region 611 and a second bottom S/D region 612, respectively, of a first and a second vertical transistor 710 and 720. The resulting first vertical fin 111 has a first vertical end 421 and a second vertical end 122, which is the second vertical end 122 of the raw vertical fin 110, and the second vertical fin 112 has a first vertical end 121, which is the first vertical end 121 of the raw vertical fin 110, and a second vertical end 422. The first bottom S/D region 611 has an edge 411 that vertically aligns with the first vertical end 421 of the first vertical fin 111 of the first vertical transistor 710. As being described above with regard to the raw vertical fin 110, the first bottom S/D region 611 extends horizontally beyond the first vertical fin 111 at the first sidewall 123 and the second sidewall 124 to have a same horizontal thickness. Similarly, the second bottom S/D region 612 has an edge 412 that vertically aligns with the second vertical end 422 of the second vertical fin 112 of the second vertical transistor 720. The second bottom S/D region 612 extends horizontally beyond the second vertical fin 112 at the first sidewall 123 and the second sidewall 124 to have a same horizontal thickness as well.

FIGS. 5A and 5B are demonstrative illustrations of cross-sectional views of a transistor structure in a step of manufacturing thereof, following the step illustrated in FIGS. 4A and 4B, according to one embodiment of present invention. More particularly, embodiments of present invention include removing the patterning mask 331 and the conformal spacer 311. Embodiments of present invention further includes filling the opening 401 with a dielectric material to form a shallow-trench-isolation (STI) region 501 that extends from the edge 411 of the first bottom S/D region 611 to the edge 412 of the second bottom S/D region 612, between the first vertical end 421 of the first vertical fin 111 and the second vertical end 422 of the second vertical fin 112. Embodiments of present invention also includes filling the openings between sidewalls of the vertical fins to form the STI regions 501 as being demonstratively illustrated in FIG. 5A.

FIGS. 6A and 6B are demonstrative illustrations of cross-sectional views of a transistor structure in a step of manufacturing thereof, following the step illustrated in FIGS. 5A and 5B, according to one embodiment of present invention. More particularly, embodiments of present invention include forming a bottom spacer 621 of the first vertical transistor 710 and a bottom spacer 622 of the second vertical transistor 720. In particular, embodiments of present invention include forming a bottom spacer 621/622 that extends from the first vertical end 421 of the first vertical fin 111 to the second vertical end 422 of the second vertical fin 112. The bottom spacer 621/622 is shared by the first and second vertical transistors 710 and 720, aligns vertically with the STI region 501 at the edge of the first bottom S/D region 611 and at the edge of the second bottom S/D region 612.

Embodiments of present invention further include forming additional features of the first vertical transistor 710 and the second vertical transistor 720 including, for example, forming gate stacks 601 and 602 surrounding, at least partially, the first and second vertical fins 111 and 112 of the first and second vertical transistors 710 and 720. For example, the gate stack 601 may cover the first sidewall 123, the second sidewall 124, and the second vertical end 122 of the first vertical fin 111. Similarly, the gate stack 602 may cover the first sidewall 123, the second sidewall 124, and the first vertical end 121 of the second vertical fin 112. Embodiments of present invention may additionally form top spacers 631 and 632, top S/D regions 641 and 642, top S/D contacts 651 and 652, bottom S/D contacts 662, and gate contact 661. Additionally, embodiments of present invention may include depositing a dielectric material to cover the first and second vertical transistors 710 and 720 in a dielectric layer 701.

Figure 7:
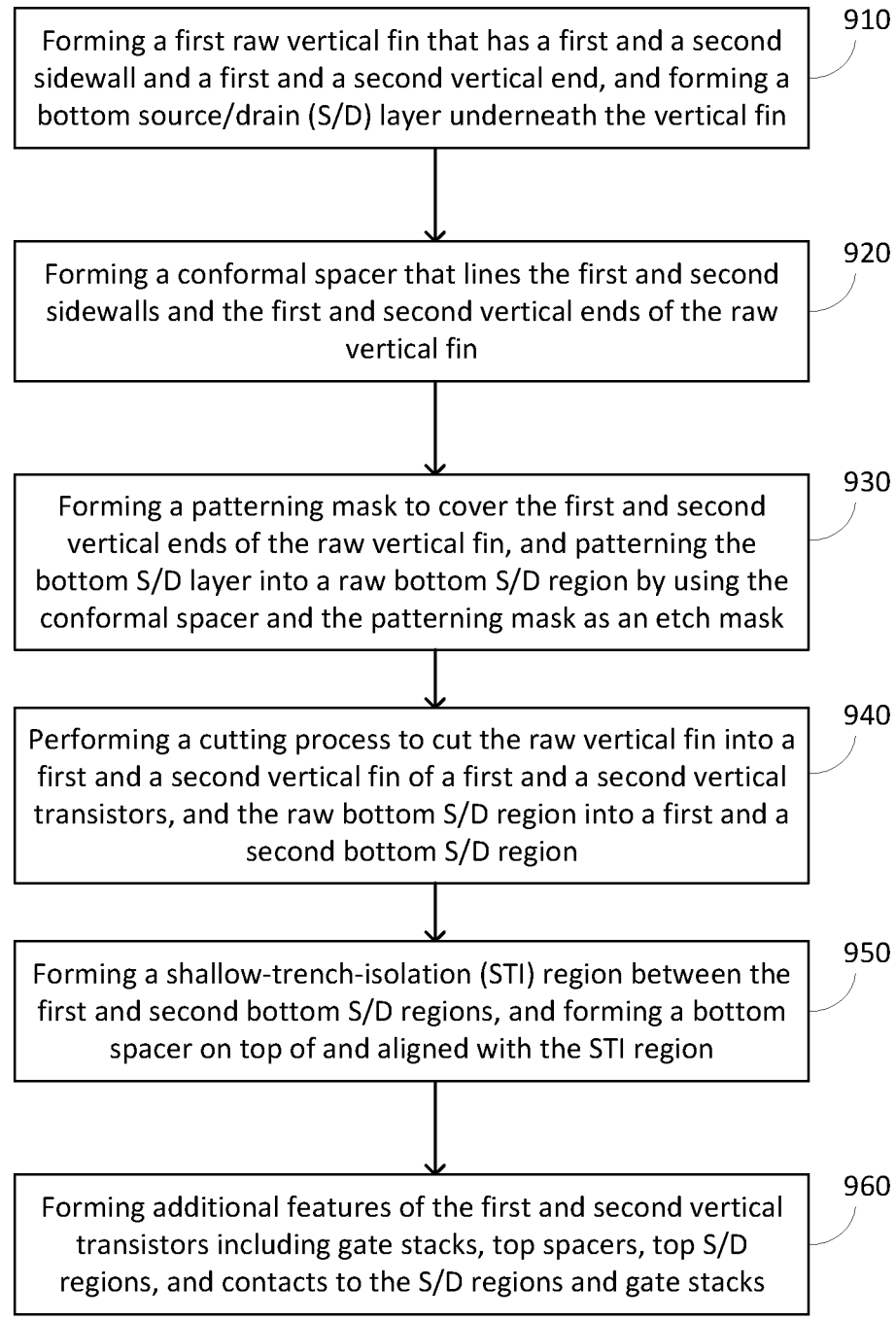
FIG. 7 is a demonstrative illustration of a flow-chart of a method of manufacturing a transistor structure according to embodiments of present invention.

FIG. 7 is a demonstrative illustration of a flow-chart of a method of manufacturing a transistor structure according to embodiments of present invention. The method includes (910) forming a first raw vertical fin that has a first and a second sidewall and a first and a second vertical end, and forming a bottom source/drain (S/D) layer underneath the first raw vertical fin; (920) forming a conformal spacer that lines the first and second sidewalls and the first and second vertical ends of the first raw vertical fin; (930) forming a patterning mask to protect the first and second vertical ends of the first raw vertical fin, and using the patterning mask and the conformal spacer as an etch mask to pattern the bottom S/D layer into a raw bottom S/D region; (940) performing a cutting process to cut the raw vertical fin into a first and a second vertical fin of a first and a second vertical transistor, and cut the raw bottom S/D region into a first and a second bottom S/D region, and thereby create an opening at least between a first vertical end of the first vertical fin and a second vertical end of the second vertical fin; (950) forming a shallow-trench-isolation (STI) region in the opening between the first and second bottom S/D regions and forming a bottom spacer on top of and aligned with the STI region; and (960) forming additional features of the first and second vertical transistors including, for example, gate stacks, top spacers, top S/D regions, and contacts to the top S/D regions and the gate stacks.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A transistor structure comprising:
   a vertical fin having a first and a second sidewall and a first and a second vertical end;
   a gate stack surrounding the first and the second sidewall and the second vertical end of the vertical fin;
   a top spacer and a gate contact both in contact with a top surface of the gate stack; and
   a bottom source/drain (S/D) region underneath the vertical fin,
   wherein the bottom S/D region has an edge that vertically aligns with the first vertical end of the vertical fin, and wherein the bottom S/D region horizontally extends beyond the vertical fin and extended portions of the bottom S/D region at the first sidewall and at the second sidewall have a same horizontal thickness.

2. The transistor structure of claim 1, further comprising:
   a shallow-trench-isolation (STI) region adjacent to the edge of the bottom S/D region; and
   a bottom spacer above the STI region and vertically aligned with the STI region at the edge of the bottom S/D region.

3. The transistor structure of claim 2, wherein the vertical fin is a first vertical fin of a first vertical transistor, and the bottom S/D region is a first bottom S/D region of the first vertical transistor, further comprising:
   a second vertical fin of a second vertical transistor, the second vertical fin having a first and a second vertical end, the second vertical end of the second vertical fin opposing the first vertical end of the first vertical fin; and
   a second bottom S/D region of the second vertical transistor,
   wherein the second bottom S/D region having an edge that vertically aligns with the second vertical end of the second vertical fin.

4. The transistor structure of claim 3, wherein the STI region extends horizontally from the edge of the first bottom S/D region of the first vertical transistor to the edge of the second bottom S/D region of the second vertical transistor.

5. The transistor structure of claim 3, wherein the bottom spacer extends horizontally from the first vertical end of the first vertical fin of the first vertical transistor to the second vertical end of the second vertical fin of the second vertical transistor.

6. A transistor structure comprising:
   a first vertical fin of a first vertical transistor, the first vertical fin having a first and a second sidewall and a first and a second vertical end;
   a first bottom source/drain (S/D) region underneath the first vertical fin, wherein the first bottom S/D region having an edge that vertically aligns with the first vertical end of the first vertical fin;
   a first gate stack surrounding the first vertical fin, wherein the first bottom S/D region horizontally extends beyond the first vertical fin, except at the edge of the first bottom S/D region that vertically aligns with the first vertical end of the first vertical fin, to have at least a portion vertically underneath the first gate stack; and
   a top spacer and a gate contact both in contact with a top surface of the gate stack,
   wherein the portions of the first bottom S/D region vertically underneath the first gate stack at the first sidewall and at the second sidewall have a same horizontal thickness.

7. The transistor structure of claim 6, further comprising:
   a shallow-trench-isolation (STI) region adjacent to the edge of the first bottom S/D region, and
   a bottom spacer above the STI region and adjacent to the first vertical end of the first vertical fin, the bottom spacer being vertically aligned with the STI region at the edge of the first bottom S/D region.

8. The transistor structure of claim 7, further comprising:
   a second vertical fin of a second vertical transistor, the second vertical fin having a first and a second vertical end; and
   a second bottom S/D region of the second vertical transistor,
   wherein the second vertical end of the second vertical fin opposes the first vertical end of the first vertical fin, and the second bottom S/D region has an edge that vertically aligns with the second vertical end of the second vertical fin of the second vertical transistor.

9. The transistor structure of claim 8, wherein the STI region extends horizontally from the edge of the first bottom S/D region of the first vertical transistor to the edge of the second bottom S/D region of the second vertical transistor.

10. The transistor structure of claim 8, wherein the bottom spacer extends horizontally from the first vertical end of the first vertical fin of the first vertical transistor to the second vertical end of the second vertical fin of the second vertical transistor.

11. A method of forming a transistor structure comprising:
forming a raw vertical fin;
forming a conformal spacer lining a first and a second sidewall and a first and a second vertical end of the raw vertical fin;
patterning a bottom source/drain (S/D) layer into a raw bottom S/D region using the conformal spacer as an etch mask;
cutting the raw vertical fin into a first and a second vertical fin with a first vertical end of the first vertical fin and a second vertical end of the second vertical fin; and
cutting the raw bottom S/D region into a first and a second bottom S/D region to create an edge of the first bottom S/D region that vertically aligns with the first vertical end of the first vertical fin and to create an edge of the second bottom S/D region that vertically aligns with the second vertical end of the second vertical fin;
forming a shallow-trench-isolation (STI) region between the first and the second bottom S/D region;
forming a gate stack on top of the STI region; and
forming a top spacer and a gate contact that are in contact with a top surface of the gate stack,
wherein the second vertical end of the raw vertical fin is a second vertical end of the first vertical fin and wherein portions of the first bottom S/D region underneath the conformal spacer at the first sidewall and at the second sidewall of the first vertical fin have a same horizontal thickness.

12. The method of claim 11, further comprising, before forming the conformal spacer, epitaxially forming the bottom S/D layer underneath the raw vertical fin, the bottom S/D layer horizontally extends beyond the raw vertical fin.

13. The method of claim 11, wherein forming the STI region comprises forming the STI region that extends from the edge of the first bottom S/D region to the edge of the second bottom S/D region.

14. The method of claim 11, further comprising forming a bottom spacer on top of the STI region, the bottom spacer extending from the first vertical end of the first vertical fin to the second vertical end of the second vertical fin.

15. The method of claim 11, wherein forming the gate stack comprises forming the gate stack between the first vertical end of the first vertical fin and the second vertical end of the second vertical fin, the gate stack being shared by the first vertical transistor and the second vertical transistor.

16. The method of claim 11, further comprising:
forming contacts to the first and second bottom S/D regions.

* * * * *